United States Patent [19]
Upadhyay

[11] Patent Number: 5,313,176
[45] Date of Patent: May 17, 1994

[54] INTEGRATED COMMON MODE AND DIFFERENTIAL MODE INDUCTOR DEVICE

[75] Inventor: Anand K. Upadhyay, Libertyville, Ill.

[73] Assignee: Motorola Lighting, Inc., Buffalo Grove, Ill.

[21] Appl. No.: 968,759

[22] Filed: Oct. 30, 1992

[51] Int. Cl.⁵ .................. H03H 7/09; H01F 17/04
[52] U.S. Cl. .................... 333/181; 333/185; 336/184; 336/221
[58] Field of Search ........... 333/177, 181, 12, 185; 336/165, 178, 183, 212, 221, 220, 181, 184, 214; 315/276, 241 R, 244

[56]     References Cited
U.S. PATENT DOCUMENTS 3,631,534 12/1971 Hirota et al. ............... 336/212 X
4,910,482  3/1990 Takagai et al. ............. 333/181
5,083,101  1/1992 Frederick .................... 333/181
5,119,059  6/1992 Cori et al. .................. 336/175
5,155,676 10/1992 Spreen ....................... 336/178 X

FOREIGN PATENT DOCUMENTS 0064813 4/1983 Japan .......................... 333/181
0081321 5/1983 Japan .......................... 333/181

Primary Examiner—Seungsook Ham
Attorney, Agent, or Firm—J. Ray Wood

[57] ABSTRACT

An integrated EMI/RFI Filter Magnetic has differential and common mode inductors wound about an I-Core. The I-Core is juxtaposed with an E-Core, with the end surfaces of the E-Core legs facing the I-Core. The magnetic has a substantially closed magnetic path for the differential inductors and the common mode inductors.

6 Claims, 1 Drawing Sheet

INTEGRATED COMMON MODE AND DIFFERENTIAL MODE INDUCTOR DEVICE

BACKGROUND OF THE INVENTION

Electronic circuits produce electromagnetic interference (EMI) and radio frequency interference (RFI). The noise can interfere with the operation of televisions, radios, telephones and similar equipment. The electrical noise can conduct through the power lines or radiate through power line or through output leads.

An electronic ballast or any other electronic circuit for powering fluorescent lights is affected by EMI/RFI noise and also produce EMI/RFI noise. A filter is therefore needed to reduce the EMI/RFI noise produced by the ballasts and to filter the EMI/RFI noise from the lines powering the ballasts.

Additionally, a filter for an electronic ballast should filter any power line transients, as well as decrease THD (total harmonic distortion).

There are two types of EMI/RFI noise. Differential noise is interference generated between the power line and the return line. Common mode noise is interference between both the power line and the return line and ground.

In some electronic ballasts, an inductor is placed in series in the power line to eliminate differential noise. Elimination of common mode noise is done by way of two inductors wound on the same core. One of the two inductors is in series with the power line and the second inductor in series with the return line.

Use of one component for the differential inductor and another component for the common mode inductor increases the cost of the ballast. The cost is high. There is difficulty in manufacturing the magnetics as well as assembly of the magnetics into the circuit board. Additional space is required on the board.

SUMMARY OF THE INVENTION

A magnetic for an EMI/RFI filter comprises a common mode inductor wound around a core, the inductor having a substantially closed magnetic path for the common mode inductor. A differential inductor is wound around the core and the inductor having a substantially closed magnetic path for the differential mode inductor.

A method of constructing the magnetic for an EMI/RFI filter uses the steps of providing an E-core with a first outer leg, a center leg, and a second outer leg, each leg having an end surface, placing a second core proximal to and spaced from the end surfaces of the E-core legs, placing a first winding about the first outer leg of the E-core, the first winding having a first number of turns, placing a second winding about the second outer leg of the E-core, the second winding having a second number of turns. The spacing between the end surface of each E-core leg and the second core, the number of turns of the first winding, and the number of turns of the second winding is adjusted to attain the desired common mode inductance and the desired differential inductance.

DESCRIPTION OF A PREFERRED EMBODIMENT

Figure 1:
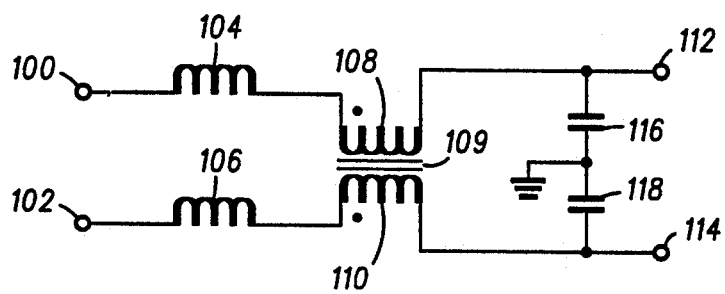
FIG. 1 is a schematic diagram of an RFI/EMI filter.

FIG. 1 shows a circuit for a RFI/EMI filter. Terminals 100, 102 receive AC powered at 60 Hz. Differential inductor 104 is in series with terminal 100 on the power line. Differential inductor 106 is in series with terminal 102 on the return line. Common mode inductors 108, 110 are wound on core 109. Common mode inductor 108 is in series with differential inductor 104 while common mode inductor 110 is in series with differential inductor 106.

Terminals 112, 114 are coupled to an additional circuit, such as a boost converter and inverter for an electronic ballast. Capacitor 116 couples terminal 112 to ground and capacitor 118 couples terminal 114 to ground.

Differential inductors 104, 106 provide RFI/EMI filtering for differential noise, while common mode inductors 108, 110 in conjunction with capacitors 116, 118 provide RFI/EMI filtering for common mode noise.

Figure 2:
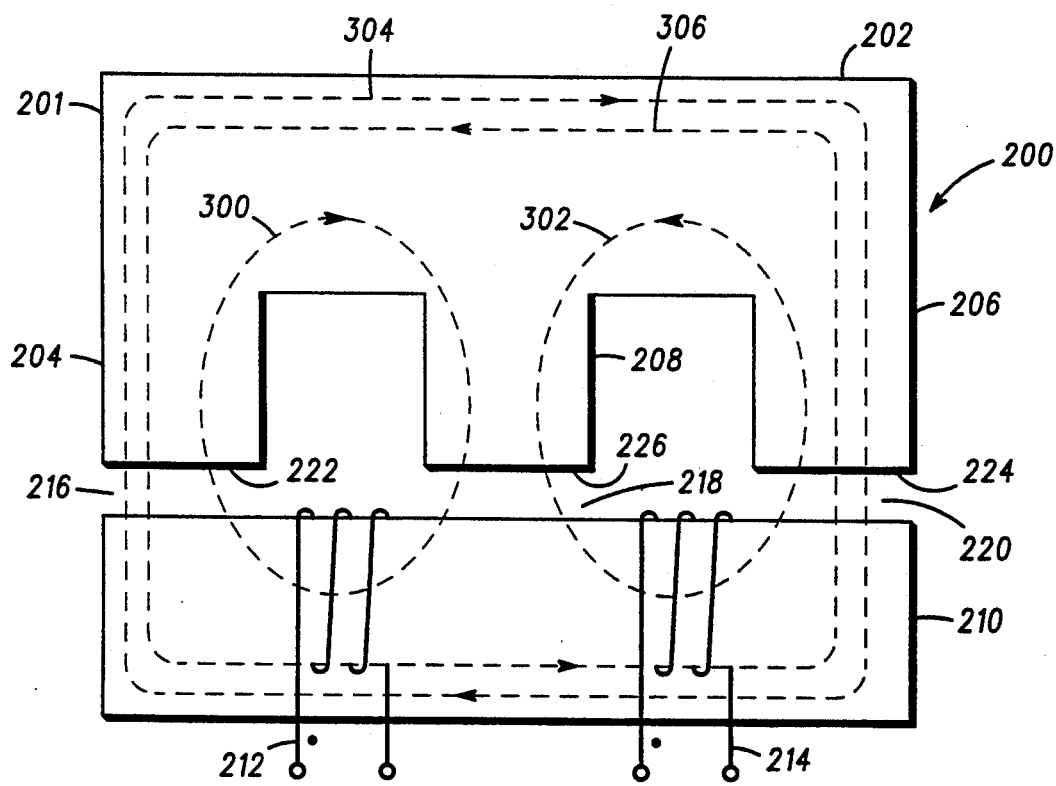
FIG. 2 is an integrated magnetic for inductors in an RFI/EMI filter.

FIG. 2 shows integrated magnetic 200 for differential inductors 106, 104 and common mode inductors 108, 110.

Integrated magnetic 200 has a two-part core. E-core 202 has upper portion 201, first outer leg 204, second outer leg 206 and center leg 208. Legs 204, 206, 208 may be slightly spaced from a second core, I-core 210. Winding 212 is positioned on I-core 210 between outer leg 204 and center leg 208, and winding 214 is positioned on I-core 210 between outer leg 206 and center leg 208. Windings 212, 214 could be wound on opposing outer legs 204, 206. The terminals of first winding 212 is connected in series with the power line. The terminals of second winding 214 is connected in series with the return line.

First outer leg 204 is spaced from I-bar 210 by first outer leg gap 216. Center leg 208 is spaced from I-bar 210 by center leg gap 218. Second outer leg 206 is spaced from I-bar 210 by second outer leg gap 220. Core legs 204, 206, 208 have end surfaces 222, 224, 226 (respectively).

Flux lines 300, 302, 304 and 306 illustrate the magnetic path and operation of magnetic 200. Flux line 300 shows the flux for differential inductor 104. Flux line 300 goes through first outer leg 204, a section of upper portion 201, center leg 208 and a section of I-core 210. Thus, winding 212 in association with E-core 202 and I-core 210 acts as differential inductor 104.

Flux lines 304, 306 go through first outer leg 204, upper portion 201, second outer leg 206 and I-core 210. Flux lines 304, 306 are in opposite direction. Flux lines 304, 306 unite windings 212, 214. Thus, windings 212, 214 in association with E-core 202 and I-core 210 form common mode inductors 108, 110, respectively.

Flux line 302 illustrates the flux for differential inductor 106. Flux line 302 goes through second outer leg 206, a section of upper portion 201, center leg 208 and a section of I-core 210. Thus, winding 214 in association with E-core 202 and I-core 210 acts as differential inductor 106.

The magnetic path for the differential inductors 104, 106 and common mode inductors 108, 110 are closed.

Adjustment of gaps 216, 218, and 220 along with altering the number of turns of windings 212, 214 results in an ability to independently adjust the inductances of inductors 104, 106, 108, 110.

As is well known:

$$L = \frac{0.4\pi N^2 A_c \cdot 10^{-8}}{l_g}$$

Where L=inductance, N=number of turns in winding, $A_c$=cross sectional area of the core, $l_g$=gap in the core.

To determine the inductance of differential inductor 104, N is the number of turns of winding 212, and $l_g$ is the sum of the distance of outer leg gap 216 and center leg gap 218. For the inductance of differential inductor 106, N is the number of turns of winding 214, while $l_g$ is the sum of the distance of outer leg gap 220 and center leg gap 218.

The inductance of common mode inductor 108 would be found by using the number of turns of winding 212 as N and the sum of distance of outer leg gap 220 and outer leg gap 216. Similarly, the inductance of common mode inductor 110 would be found by using the number of turns of winding 214 as N and the sum of distance of outer leg gap 220 and outer leg gap 216.

By varying the number of turns of windings 212, 214 and the distance of gaps 216, 218, and 220, the inductance of inductors 104, 106, 108, 110 can be changed. Further, the inductance of differential inductors 104, 106 may be established independent of the inductance of common mode inductors 108, 110.

If gaps 216, 220 are zero, then the inductance of common mode inductor 108, 110 is large, while the inductance of differential inductor 104, 106 is small. If gaps 216, 220 are not zero, but gap 218 is zero, then the inductance of common mode inductors 108, 110 is small while the inductance of differential inductors 104, 106 is large.

There are advantages associated with magnetic 200. Due to the use of an E-core and an I-core, versus two E-cores, for the common mode inductor, the price is less than a conventional common mode inductor. (It is possible to use two E-cores.) Two windings instead of three or four windings are used for the common mode inductors and the differential inductors. Fabrication of circuits using the magnetic is simpler because less parts are used.

Because the windings are positioned on the I-core, it is possible to wind them on a single bobbin or directly on the I-core in one operation, reducing the difficulty is manufacturing the magnetic.

Additionally, because the differential inductor has a closed magnetic path, the number of turns of the windings to achieve a desired inductance are decreased. The result is that larger inductances are possible so that the filtering function is much improved.

I claim:

1. An inductor assembly for an EMI/RFI filter comprising:
    an E-core having a body, a first outer E-core leg, a second outer E-core leg, a center E-core leg, each E-core leg having an end surface distal from the E-core body;
    a second core positioned proximal to the end-surface of each E-core leg;
    a first coil winding wound around the second core and between the first outer E-core leg and the center E-core leg;
    a second coil winding wound around the second core and between the second outer E-core leg and the center E-core leg;
    the second core and the E-core forming at least two closed magnetic paths for each windings, such that the first coil winding has a first independent magnetic path, the second coil winding has a second independent magnetic path, and the first coil winding and the second coil winding have a joint magnetic path;
    the combination of the first coil and the second coil forming a common mode inductor and either the first coil winding or the second coil winding forming a differential mode inductor;
    the distance between the end-surface of each E-core leg and the second core being fixedly adjustable whereby the inductance of the common mode inductor and the inductance of the differential inductor are independent of the other.

2. The magnetic of claim 1 where the second core is an I-core.

3. The magnetic of claim 2 where the first coil winding has a first number of turns around the second core and the second coil winding has a second number of turns around the second core, and the first number of turns and the second number of turns is dependent upon the desired inductance of the differential inductor and the common mode inductor.

4. A method of constructing an inductor device for an EMI/RFI filter, the inductor device having a desired common mode inductance and a desired differential inductance, the desired differential inductance consisting of a first coil winding differential inductance and a second coil winding differential inductance, comprising the steps of:
    providing an E-core with a first outer leg, a center leg, and a second outer leg, each leg having an end surface;
    placing a second core proximal to and spaced from the end surfaces of the E-core legs, thereby forming a first and second window;
    placing a first coil winding about the second core in the first window the first winding having a first number of turns;
    placing a second coil winding about the second core in the second window, the second coil winding having a second number of turns;
    adjusting the spacing between the end surface of each E-core leg and the second core while adjusting the first number of turns and the second number of turns so as to attain the desired common mode inductance and the desired differential inductance.

5. An inductor assembly comprising:
    a two-part core comprising an E-core and a second core, the E-core having a plurality of legs extending from a body, the legs having an end-face distal from the body, the end-face of each leg substantially juxtaposed with the second core, where the end-face of each leg is in proximity to but spaced from the second core, thereby forming a plurality of gaps, the E-core and second core thereby forming first and second windows;
    the gap between the second core and the end face of at least one leg is a different distance than the gaps for the other two legs;
    the two-part core having at least two substantially closed magnetic paths;

a first coil winding wound around the second core in the first window;

a second coil winding wound around the second core in the second window;

whereby the assembly provides a common mode inductor and a differential inductor such that the inductance of the common mode inductor is independent from the inductance of the differential mode inductor.

6. The assembly of claim 5 where the second core is an I-core.

* * * * *